(12) United States Patent
Su (10) Patent No.: US 8,669,568 B2
(45) Date of Patent: Mar. 11, 2014

(54) LIGHT EMITTING DEVICE USABLE FOR VARIABLE DRIVING VOLTAGES

(75) Inventor: Hwa Su, Taipei (TW)

(73) Assignee: InterLight Optotech Corporation, Yangemi, Taoyuan County (TW)

( * ) Notice: Subject to any disclaimer, the term of this patent is extended or adjusted under 35 U.S.C. 154(b) by 323 days.

(21) Appl. No.: 13/011,484

(22) Filed: Jan. 21, 2011

(65) Prior Publication Data

US 2012/0091476 A1 Apr. 19, 2012

(30) Foreign Application Priority Data

Oct. 13, 2010 (TW) ............................. 99134981 A (51) Int. Cl.
*H01L 29/18* (2006.01)
*H01L 33/00* (2010.01)
*F21L 4/02* (2006.01)
*H05B 37/00* (2006.01)

(52) U.S. Cl.
USPC ............... 257/88; 438/34; 362/227; 315/184

(58) Field of Classification Search
None
See application file for complete search history.

(56) References Cited

U.S. PATENT DOCUMENTS

| 5,187,377 | A | | 2/1993 | Katoh | |
|---|---|---|---|---|---|
| 5,278,432 | A | * | 1/1994 | Ignatius et al. | 257/88 |
| 6,547,249 | B2 | * | 4/2003 | Collins et al. | 257/88 |
| 6,949,772 | B2 | | 9/2005 | Shimizu et al. | |
| 8,129,729 | B2 | * | 3/2012 | Sakai et al. | 257/88 |
| 2004/0075399 | A1 | * | 4/2004 | Hall | 315/291 |
| 2006/0163589 | A1 | | 7/2006 | Fan et al. | |
| 2008/0083929 | A1 | | 4/2008 | Fan et al. | |
| 2008/0170396 | A1 | | 7/2008 | Yuan et al. | |
| 2008/0211416 | A1 | * | 9/2008 | Negley et al. | 315/193 |
| 2008/0277677 | A1 | | 11/2008 | Kuo et al. | |
| 2009/0267085 | A1 | * | 10/2009 | Lee et al. | 257/88 |
| 2009/0294780 | A1 | * | 12/2009 | Chou et al. | 257/88 |
| 2009/0316409 | A1 | * | 12/2009 | Kim et al. | 362/249.14 |
| 2010/0109558 | A1 | * | 5/2010 | Chew | 315/294 |
| 2010/0252840 | A1 | | 10/2010 | Ibbetson et al. | |

FOREIGN PATENT DOCUMENTS

| CN | 101075609 A | 11/2007 |
|---|---|---|
| CN | 101532612 A | 9/2009 |
| CN | 101614333 A | 12/2009 |
| CN | 101789422 A | 7/2010 |
| DE | 20309446 U1 | 8/2003 |
| JP | 61-65488 | 5/1986 |
| JP | 2007311398 A | 11/2007 |
| JP | 2008071140 A | 3/2008 |
| JP | 2009059883 A | 3/2009 |
| JP | 2010027943 A | 2/2010 |
| JP | 2010517274 A | 5/2010 |
| KR | 20070023950 A | 3/2007 |
| KR | 20070099350 A | 10/2007 |
| KR | 20080055366 A | 6/2008 |
| WO | WO 2009146257 A1 * | 12/2009 |

OTHER PUBLICATIONS

Japan Patent Office, "Office Action", Oct. 2, 2012, Japan.

* cited by examiner

*Primary Examiner* — Andres Munoz
(74) *Attorney, Agent, or Firm* — Muncy, Geissler, Olds & Lowe, PLLC (57) ABSTRACT

A light emitting device includes a light emitting unit and a submount. The light emitting unit has a plurality of light emitting diodes (LEDs), and the submount has a plurality of conductive contacts on a side thereof. The LEDs are coupled to the conductive contacts in various electrical connection manners, such that the LEDs are connected in series or/and in parallel.

12 Claims, 12 Drawing Sheets

LIGHT EMITTING DEVICE USABLE FOR VARIABLE DRIVING VOLTAGES

CROSS-REFERENCE TO RELATED APPLICATIONS

This non-provisional application claims priority under 35 U.S.C. §119(a) on Patent Application No(s). 099134981 filed in Taiwan, R.O.C. on Oct. 13, 2010, the entire contents of which are hereby incorporated by reference.

BACKGROUND OF THE INVENTION

1. Field of Invention

The present invention relates to a light emitting device, and more particularly to a flip-chip bonded light emitting device, in which light emitting diodes (LEDs) in the light emitting device are selectively connected in series or/and in parallel.

2. Related Art

Light emitting diodes (LEDs) are advantageous in low power consumption, high efficient and long service life, and thus are broadly applicable to various application fields, for example, light sources used in backlight modules of notebooks, monitors, cell phones, televisions, and liquid crystal displays. Further, more and more researchers and developers are devoting themselves to the research and development of the LED, such that the intensity of the current LEDs is sufficient for illumination.

In a conventional LED structure, a single-chip LED is disposed on a semiconductor substrate, with positive and negative poles of the LED chip facing upwards, the positive and negative poles of the chip are then electrically connected to pins through wire bonding, and the entire is encapsulated to form a complete LED encapsulation. The conventional LED structure forms the encapsulation by using only a single chip, and the light source generated thereby is not intense enough, thus cannot satisfying current requirement on high brightness.

Therefore, an LED die provided with a plurality of LEDs therein is developed, and the LED die is bonded to a submount through flip-chip bonding.

The conventional LED has a driving voltage approximately ranged from 3 volts to 4 volts, and the LEDs in the LED die are connected in series. Therefore, manufacturers may design LEDs of different numbers in an LED die, so as to connect in series to obtain a high voltage light emitting device, such that single light emitting devices may emit more intense light source, thus providing higher light emitting performance.

However, during manufacturing of LEDs in the conventional LED die, the LEDs are electrically connected in series in advance, so the manufactured light emitting devices all have a fixed driving voltage value. If light emitting devices having different driving voltages are required, LED dies of different specifications must be manufactured correspondingly, which has poor design flexibility and increases the manufacturing cost.

SUMMARY OF THE INVENTION

In view of the above-mentioned problems, the present invention is a light emitting device, so as to eliminate problems of poor design flexibility and increased manufacturing cost of the conventional light emitting device resulting from that LEDs in the conventional light emitting device are electrically connected in series in advance.

In an embodiment of the present invention, a light emitting device comprises a light emitting unit and a submount. The light emitting unit is provided with a plurality of first LEDs, and the submount is provided with a plurality of first conductive contacts on a side thereof. The first conductive contacts are coupled to the first LEDs, such that the first LEDs are connected in series.

In another embodiment of the present invention, a light emitting device comprises a light emitting unit and a submount. The light emitting unit is provided with a plurality of first LEDs, and the submount is provided with a plurality of first conductive contacts on a side thereof. Each of the first conductive contacts is correspondingly coupled to each of the first LEDs, such that the first LEDs are connected in parallel.

In still another embodiment of the present invention, a light emitting device comprises a light emitting unit and a submount. The light emitting unit is provided with a plurality of first LEDs and a plurality of second LEDs, and the submount is provided with a plurality of first conductive contacts and a plurality of second conductive contacts.

The first conductive contacts are coupled to the first LEDs, such that the first LEDs are connected in series. Each of the second conductive contacts is correspondingly coupled to each of the second LEDs, such that the second LEDs are connected in parallel.

The present invention has the following effects. Multiple LEDs of the light emitting unit are not electrically connected in series, and through different layout designs of multiple conductive contacts on the submount, when the light emitting unit is bonded to the submount through flip-chip bonding, the LEDs are electrically connected in series or/and in parallel correspondingly, thus improving the design flexibility of the light emitting device, reducing the manufacturing cost, and being applicable to form high voltage light emitting device.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 2:
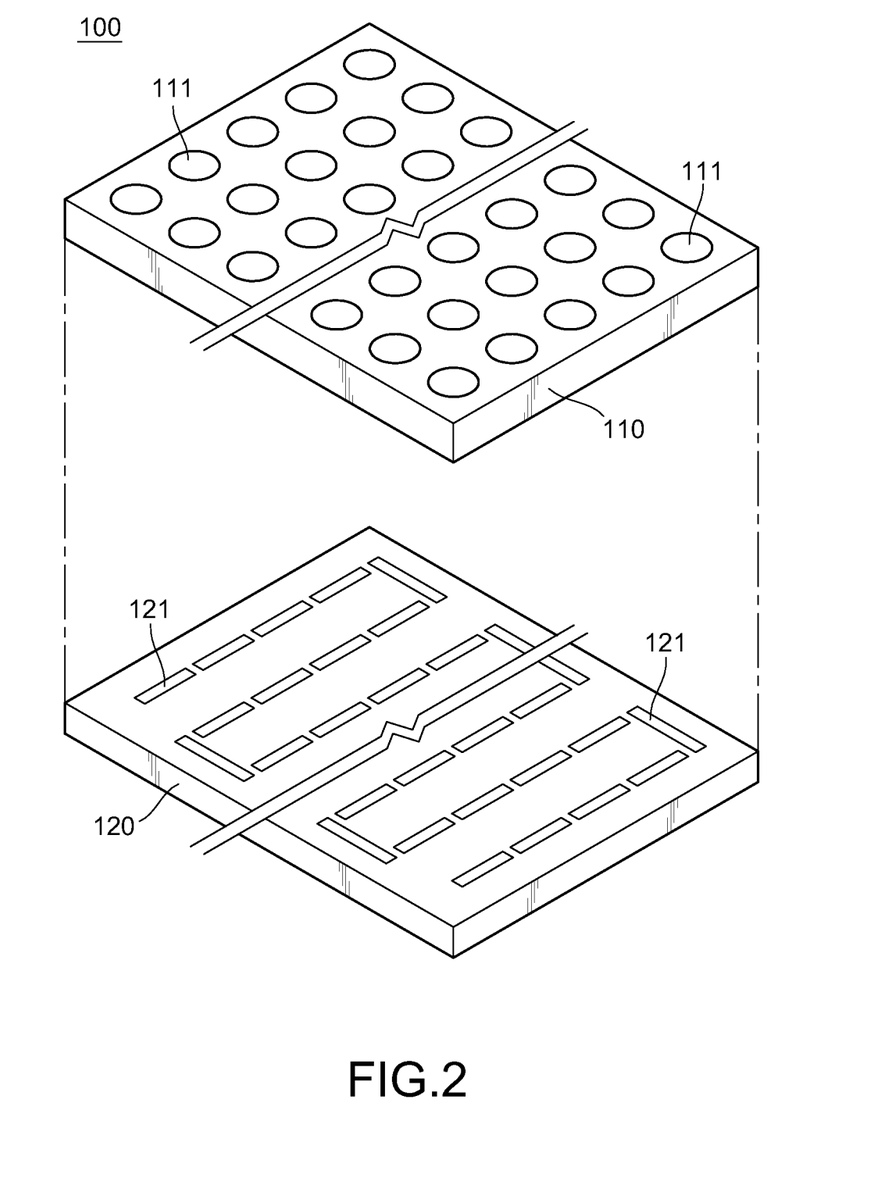
FIG. 2 is a schematic exploded view of a first embodiment according to the present invention.
Figure 3:
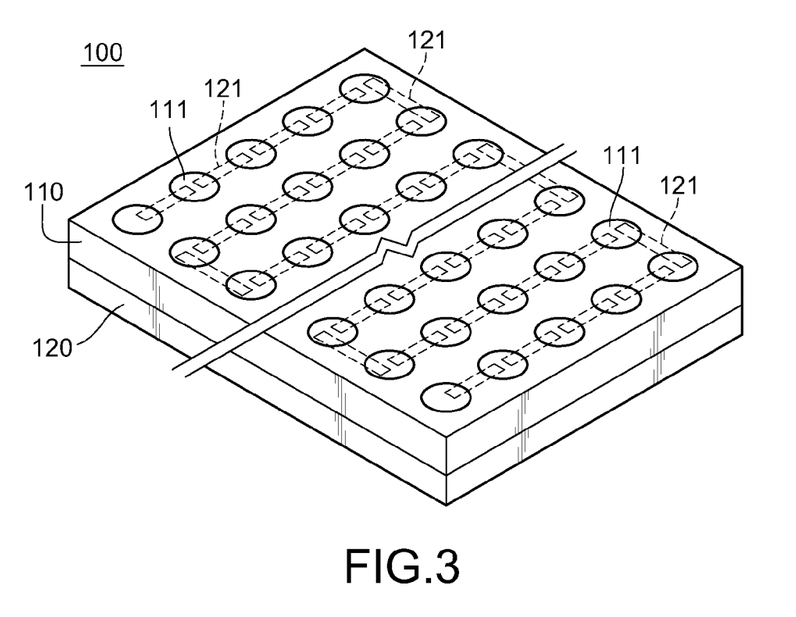
FIG. 3 is a schematic three-dimensional view of the first embodiment according to the present invention.
Figure 4:
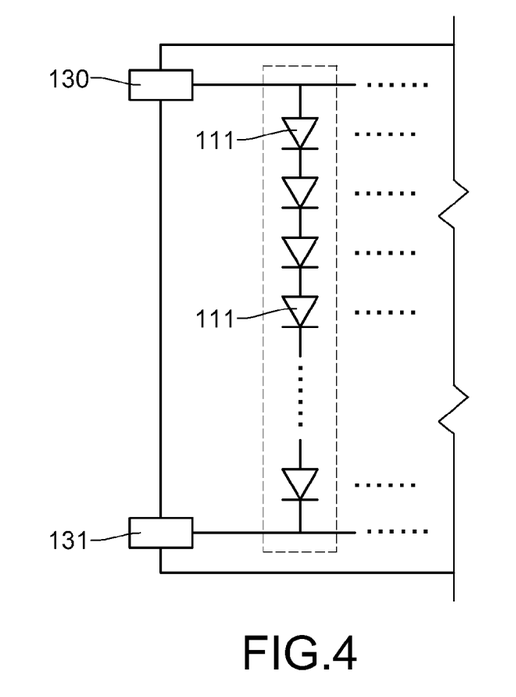
FIG. 4 is a schematic circuit diagram of the first embodiment according to the present invention.

FIGS. 2 to 4 are schematic three-dimensional views and a schematic circuit diagram of a first embodiment of the present invention. As shown in the figures, a light emitting device 100 according to the first embodiment of the present invention comprises a light emitting unit 110 and a submount 120. The light emitting unit 110 is bonded to a side (a top surface) of the submount 120 through flip-chip bonding.

Compared with the conventional wire bonding method, the method of bonding the light emitting unit 110 and the submount 120 through flip-chip bonding may greatly improve the alignment precision and reliability of the light emitting device 100, thus reducing the error during assembling and alleviating the defect of over large encapsulation volume due to wires.

Referring to FIGS. 2 to 4, the light emitting unit 110 according to the first embodiment of the present invention is provided with a plurality of first LEDs 111. The first LEDs 111 are arranged at uniform intervals to form a matrix, and are electrically connected to electrodes 130 and 131, and the first LEDs 111 are driven by a voltage to emit illuminating light rays. The number of the first LEDs 111 of this embodiment may be increased or reduced according to actual requirements, and is not limited to the number as described in this embodiment.

Figure 1:
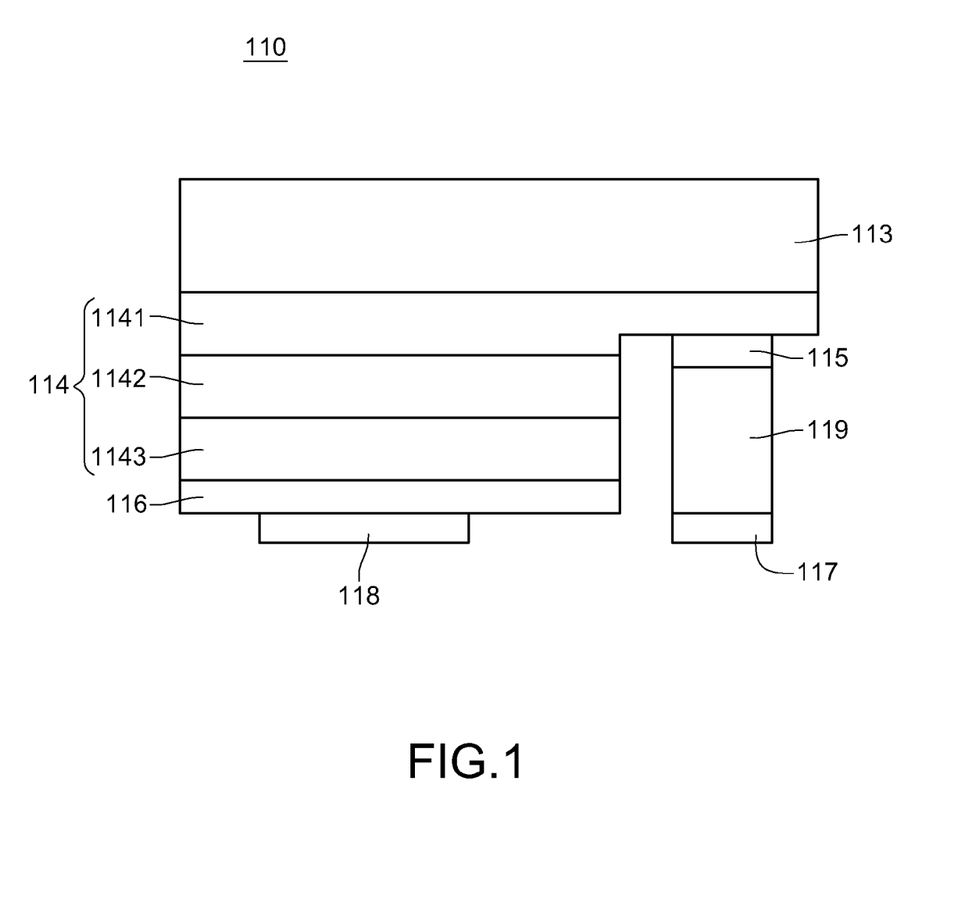
FIG. 1 is a schematic structural view of a light emitting unit according to the present invention.

For example, as shown in FIG. 1, the light emitting unit 110 may comprise a transparent substrate 113, a light emitting lamination 114, a first contact layer 115, a second contact layer 116, a first electrode 117, and a second electrode 118. The transparent substrate 113 is made of a material selecting from a group consisting of $Al_2O_3$, GaN, glass, GaP, SiC, and chemical vapor deposition (CVD) diamond. The light emitting lamination 114 is formed on the transparent substrate 113, and is driven by a voltage to emit light rays. A color of the light ray depends on a material of the light emitting lamination 114.

The light emitting lamination 114 comprises a first electric semiconductor layer 1141, an active layer 1142, and a second electric semiconductor layer 1143. The first electric semiconductor layer 1141 may be an n-type or a p-type semiconductor layer, and the second electric semiconductor layer 1143 has an electric property opposite to that of the first electric semiconductor layer 1141. A part of the second electric semiconductor layer 1143 and the active layer 1142 are etched to expose a part of the first electric semiconductor layer 1141. The first contact layer 115 is formed on the exposed first electric semiconductor layer 1141, the second contact layer 116 is formed on the second electric semiconductor layer 1143, and the first contact layer 115 and the second contact layer 116 are used for forming ohmic contact with the first electric semiconductor layer 1141 and the second electric semiconductor layer 1143 respectively. The first electrode 117 is formed on the first contact layer 115, and the second electrode 118 is formed on the second contact layer 116. The light emitting unit 110 further comprises an electrode pad 119 formed between the first contact layer 115 and the first electrode 117, for providing a current channel when being directed bonded to the submount, such that the current is conducted to the submount.

The submount 120 may be made of sapphire, SiC, Si, GaAs, or AlN, and those skilled in the art may select other suitable semiconductor materials to implement the submount 120 in this embodiment, which is not limited thereto. A plurality of first conductive contacts 121 is electrically disposed on the top surface of the submount 120, and when the light emitting unit 110 is bonded to the submount 120, the first conductive contacts 121 of the submount 120 are coupled to the first LEDs 111 of the light emitting unit 110, such that the first LEDs 111 are electrically connected in series (as shown in FIG. 4). The first conductive contacts 121 may be made of any conductive metal material, non-metal material, or semi-conductor material, which is not limited thereto.

Specifically, the first conductive contacts 121 on the submount 120 of this embodiment are arranged on the surface of the submount 120, such that each of the first conductive contacts 121 is electrically connected to an N pole of an adjacent one of the first LEDs 111 and a P pole of another adjacent one of the first LEDs 111, and the first conductive contacts 121 are electrically connected to the first LEDs 111 sequentially, such that the first LEDs 111 are electrically connected in series.

For example, as shown in FIG. 2, the plurality of first conductive contacts 121 in this embodiment is disposed on the submount 120 sequentially in a loop connection arrangement, so as to be corresponding to the first LEDs 111 arranged in a matrix. However, those skilled in the art may change the disposing configuration of the first LEDs 111 according to actual requirements, and the first conductive contacts 121 must also change the disposing form thereof accordingly, so as to conform to the electrical connection relation that the first conductive contacts 121 and the first LEDs 111 are electrically connected in series.

The electrical connection relation of the light emitting unit 110 and the submount 120 of the present invention is simplified in this embodiment as six rows of first LEDs 111 and the first conductive contacts 121 of the same number; however, the electrical connection relation between the first LEDs 111 and the first conductive contacts 121 of the present invention is not limited thereto.

Figure 5:
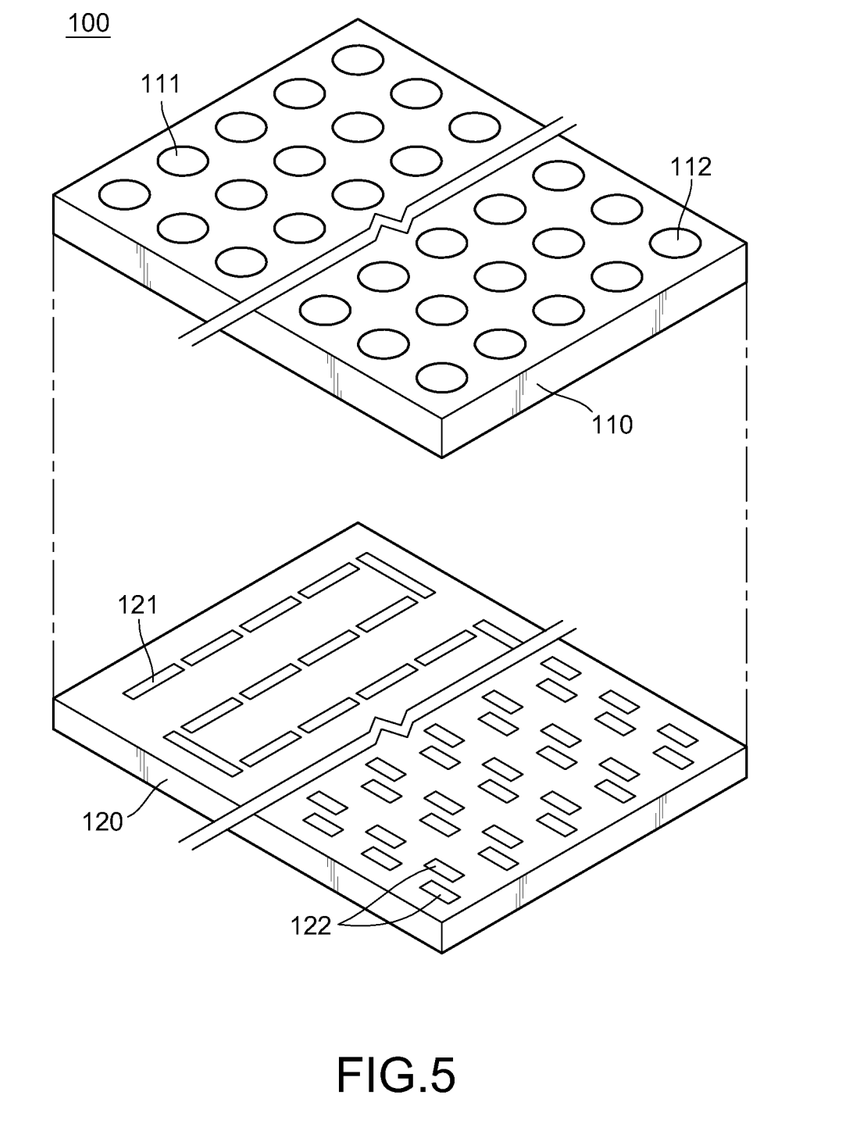
FIG. 5 is a schematic exploded view of a second embodiment according to the present invention.

Referring to FIG. 5, a schematic three-dimensional view of a second embodiment of the present invention is shown, and since the second embodiment has a structure approximately the same as that of the first embodiment, only differences are illustrated herein. In the second embodiment, in addition to having a plurality of first LEDs 111, a light emitting unit 110 of a light emitting device 100 is further provided with a plurality of second LEDs 112, and in addition to having a plurality of first conductive contacts 121, a submount 120 is further provided with a plurality of second conductive contacts 122. In this embodiment, the second LEDs 112 are driven by a voltage to emit illuminating light rays, and the number of the second LEDs 112 may be increased or reduced according to actual requirements, which is not limited to the number as described in this embodiment. The second conductive contacts 122 may be made of any conductive metal material, non-metal material, or semiconductor material, which is not limited thereto.

For example, as shown in FIG. 1, the light emitting unit 110 may comprise a transparent substrate 113, a light emitting lamination 114, a first contact layer 115, a second contact layer 116, a first electrode 117, and a second electrode 118. The transparent substrate 113 is made of a material selected from a group consisting of $Al_2O_3$, GaN, glass, GaP, SiC, and chemical vapor deposition, (CVD) diamond. The light emitting lamination 114 is formed on the transparent substrate 113, and driven by a voltage to emit light rays. A color of the light ray depends on a material of the light emitting lamination 114.

The light emitting lamination 114 comprises a first electric semiconductor layer 1141, an active layer 1142, and a second electric semiconductor layer 1143. The first electric semiconductor layer 1141 may be an n-type or a p-type semiconductor layer, and the second electric semiconductor layer 1143 has an electric property opposite to that of the first electric semiconductor layer 1141. A part of the second electric semiconductor layer 1143 and the active layer 1142 are etched to expose a part of the first electric semiconductor layer 1141. The first contact layer 115 is formed on the exposed first electric semiconductor layer 1141, the second contact layer 116 is formed on the second electric semiconductor layer 1143, and the first contact layer 115 and the second contact layer 116 are used for forming ohmic contact with the first electric semiconductor layer 1141 and the second electric semiconductor layer 1143 respectively. The first electrode 117 is formed on the first contact layer 115, and the second electrode 118 is formed on the second contact layer 116. The light emitting unit 110 further comprises an electrode pad 119 formed between the first contact layer 115 and the first electrode 117, for providing a current channel when being directed bonded to the submount, such that the current is conducted to the submount.

As shown in FIG. 5, the second LEDs 112 are adjacent to the first LEDs 111 and form a matrix with the first LEDs 111, and the second conductive contacts 122 are disposed adjacent to the first conductive contacts 121. The second conductive contacts 122 are electrically disposed on the submount 120 in pairs, and two second conductive contacts 122 are interlaced, thereby being respectively corresponding to N poles and P poles of the second LEDs 112. Therefore, when the light emitting unit 110 is bonded to the submount 120, two second conductive contacts 122 are electrically connected to the N pole and the P pole of one of the second LEDs 112 respectively, thereby forming an electrical conduction relation, such that the second LEDs 112 emit illuminating light rays according to the original driving voltage.

The electrical connection relation of the light emitting unit 110 and the submount 120 of the present invention is simplified in this embodiment as three rows of first LEDs 111 and the first conductive contacts 121 of the same number, and three rows of second LEDs 112 and the second conductive contacts 122 of the same number; however, the electrical connection relations between the first LEDs 111 and the first conductive contacts 121 and between the second LEDs 112 and the second conductive contacts 122 of the present invention are not limited thereto.

Figure 6:
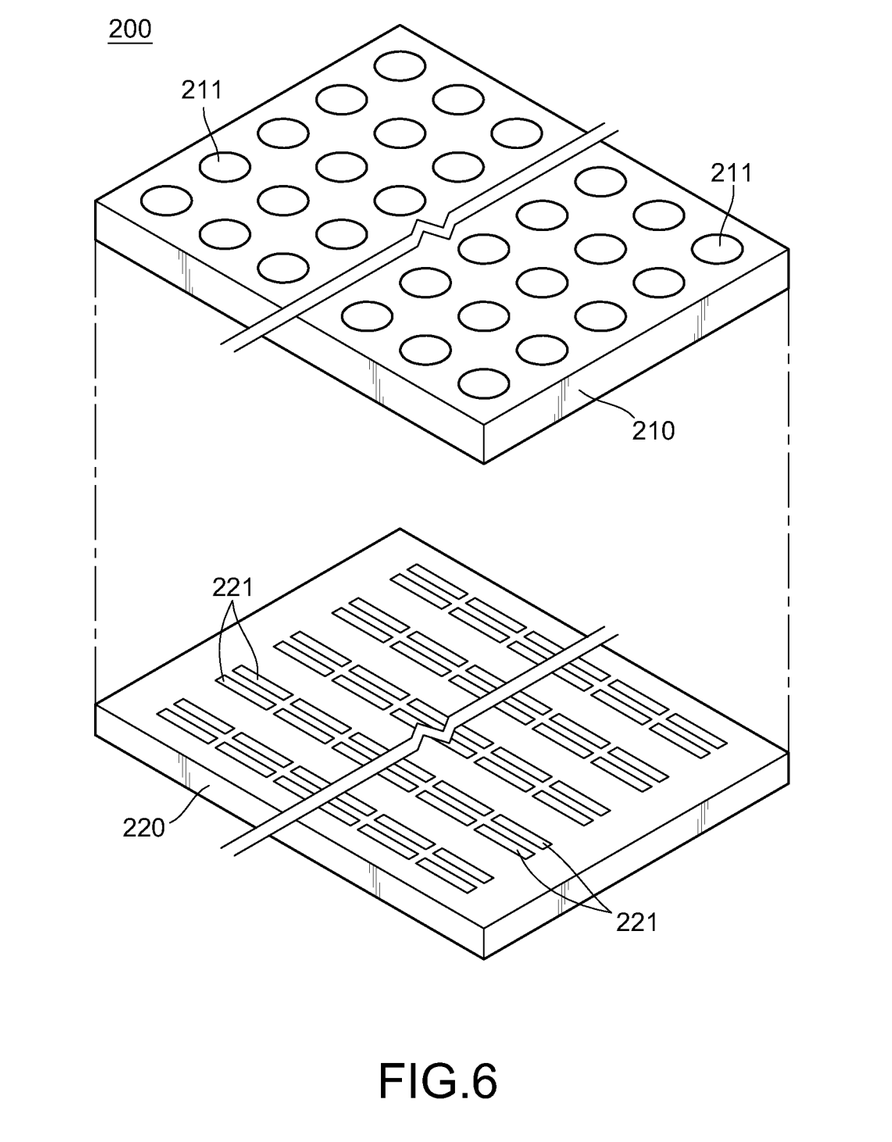
FIG. 6 is a schematic exploded view of a third embodiment according to the present invention.
Figure 7:
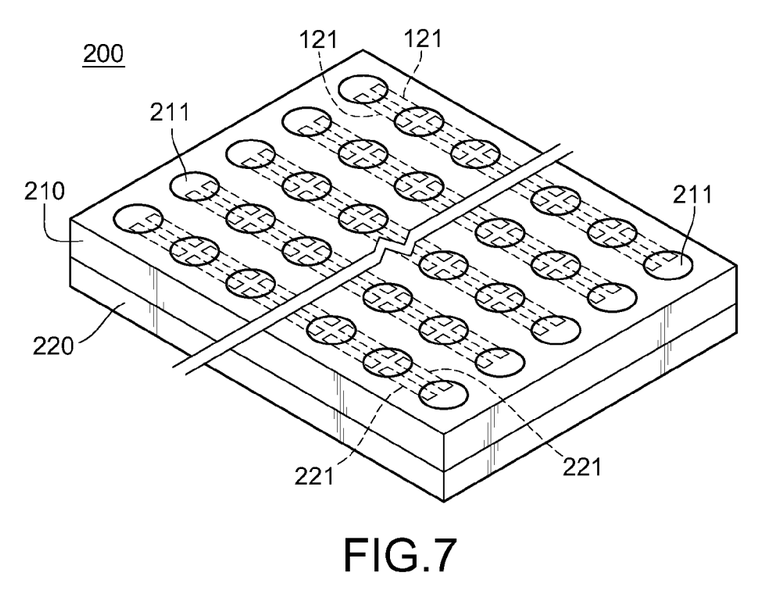
FIG. 7 is a schematic three-dimensional view of the third embodiment according to the present invention.
Figure 8:
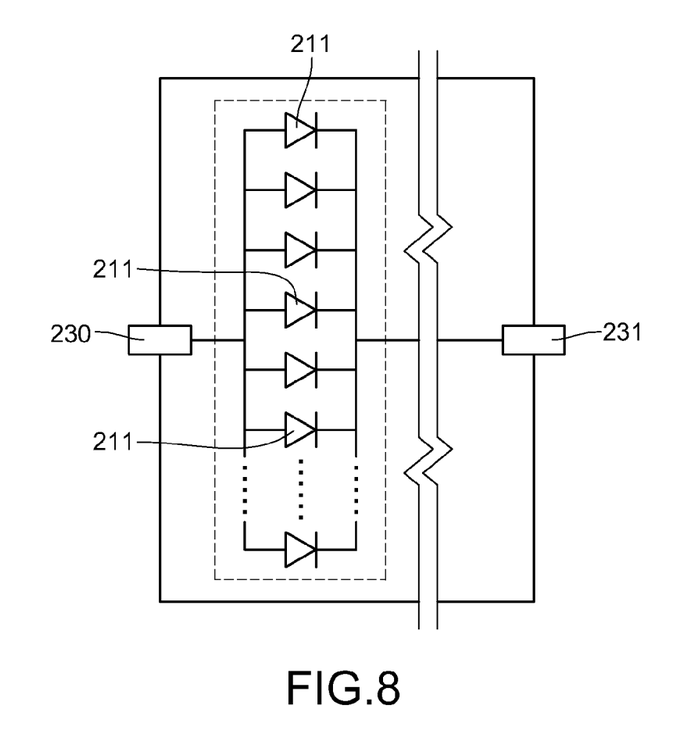
FIG. 8 is a schematic circuit diagram of the third embodiment according to the present invention.

FIGS. 6 to 8 are respectively a schematic three-dimensional view and a schematic circuit diagram of a third embodiment of the present invention. As shown in the figures, a light emitting device 200 according to the third embodiment of the present invention comprises a light emitting unit 210 and a submount 220. The light emitting unit 210 is bonded to a side (a top surface) of the submount 220 through flip-chip bonding.

Compared with the conventional wire bonding method, the method of bonding the light emitting unit 210 and the submount 220 through flip-chip bonding may greatly improve the alignment precision and reliability of the light emitting device 200, thus reducing the error during assembling and alleviating the defect of over large encapsulation volume due to wires. The light emitting unit 210 of this embodiment has a structure the same as that of the light emitting unit of the first embodiment, and thus is not repeated herein.

Referring to FIGS. 6 to 8, the light emitting unit 210 according to the third embodiment of the present invention is provided with a plurality of first LEDs 211. The first LEDs 211 are arranged at uniform intervals to form a matrix, and are electrically connected to electrodes 230 and 231, and the first LEDs 211 are driven by a voltage to emit illuminating light rays. The number of the first LEDs 211 of this embodiment may be increased or reduced according to actual requirements, and is not limited to the number as described in this embodiment.

The submount 220 may be made of sapphire, SiC, Si, GaAs, or AN, and those skilled in the art may select other suitable semiconductor materials to implement the submount 220 in this embodiment, which is not limited thereto. A plurality of first conductive contacts 221 is electrically disposed on the top surface of the submount 220, and when the light emitting unit 210 is bonded to the submount 220, each of the first conductive contacts 221 of the submount 220 is correspondingly coupled to each of the first LEDs 211 of the light emitting unit 210, such that the first LEDs 211 are electrically connected in parallel (as shown in FIG. 8).

Specifically, the first conductive contacts 221 on the submount 220 of this embodiment are disposed on the surface of the submount 220 in parallel and at intervals, such that each pair of the first conductive contacts 121 is electrically connected to an N pole of an adjacent one of the first LEDs 211 and a P pole of another adjacent one of the first LEDs 211, such that the adjacent first LEDs 211 are electrically connected in parallel.

The electrical connection relation of the light emitting unit 210 and the submount 220 of the present invention is simplified in this embodiment as 6 rows of first LEDs 211 and the first conductive contacts 221 of the same number; however, the electrical connection relation between the first LEDs 211 and the first conductive contacts 221 of the present invention is not limited thereto.

Figure 9:
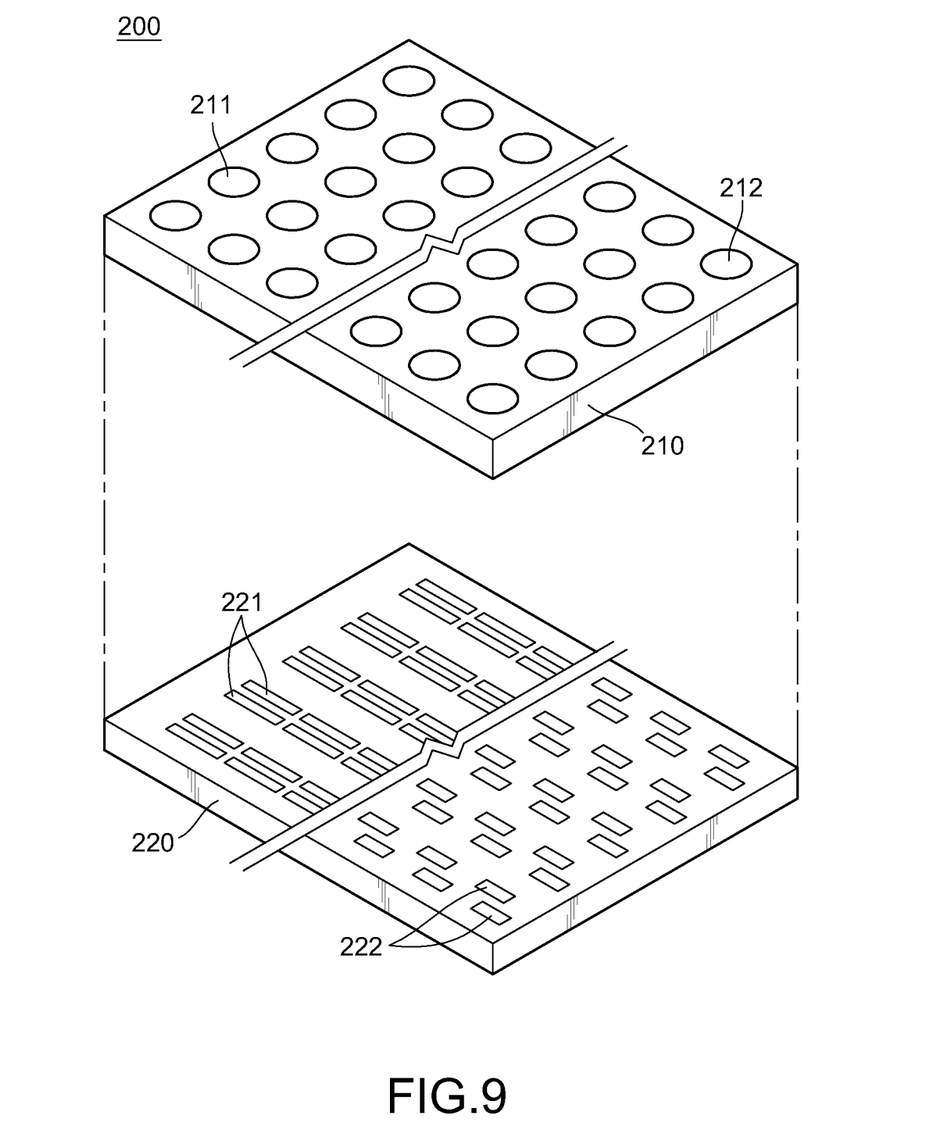
FIG. 9 is a schematic exploded view of a fourth embodiment according to the present invention.

Referring to FIG. 9, a schematic three-dimensional view of a fourth embodiment of the present invention is shown, and since the fourth embodiment has a structure approximately the same as that of the third embodiment, only differences are illustrated herein. In the fourth embodiment, in addition to having a plurality of first LEDs 211, a light emitting unit 210 of a light emitting device 200 is further provided with a plurality of second LEDs 212, and in addition to having a plurality of first conductive contacts 221, a submount 220 is further provided with a plurality of second conductive contacts 222. In this embodiment, the second LEDs 212 are driven by a voltage to emit illuminating light rays, and the number of the second LEDs 212 may be increased or reduced according to actual requirements, which is not limited to the number as described in this embodiment.

The second LEDs 212 are adjacent to the first LEDs 211 and form a matrix with the first LEDs 211, and the second conductive contacts 222 are disposed adjacent to the first conductive contacts 221. The second conductive contacts 222 are electrically disposed on the submount 220 in pairs, and two second conductive contacts 222 are interlaced, thereby being respectively corresponding to N poles and P poles of the second LEDs 212. Therefore, when the light emitting unit 210 is bonded to the submount 220, two second conductive contacts 222 are electrically connected to the N pole and the P pole of one of the second LEDs 212 respectively, thereby forming an electrical conduction relation, such that the second LEDs 212 emit illuminating light rays according to the original driving voltage.

The electrical connection relation of the light emitting unit 210 and the submount 220 of the present invention is simplified in this embodiment as three rows of first LEDs 211 and the first conductive contacts 221 of the same number, and three rows of second LEDs 212 and the second conductive contacts 222 of the same number; however, the electrical connection relations between the first LEDs 211 and the first conductive contacts 221 and between the second LEDs 212 and the second conductive contacts 222 of the present invention are not limited thereto.

Figure 10:
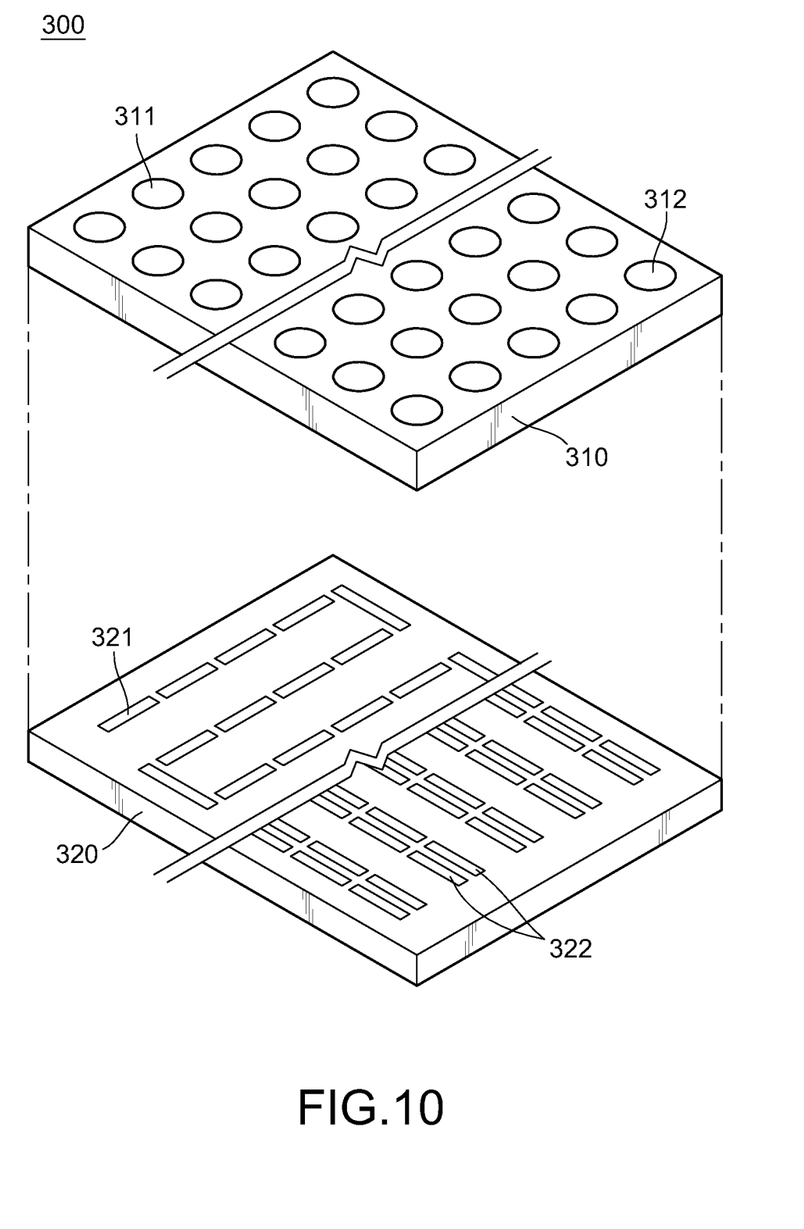
FIG. 10 is a schematic exploded view of a fifth embodiment according to the present invention.
Figure 11:
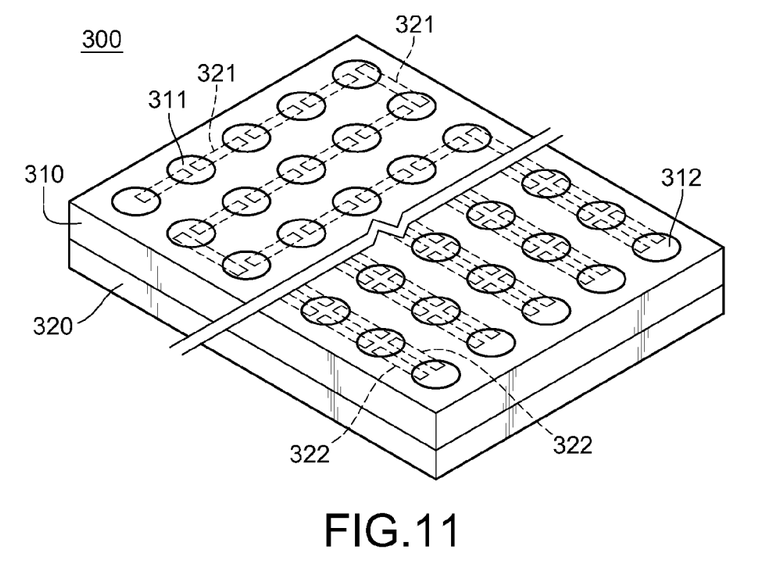
FIG. 11 is a schematic three-dimensional view of the fifth embodiment according to the present invention.
Figure 12:
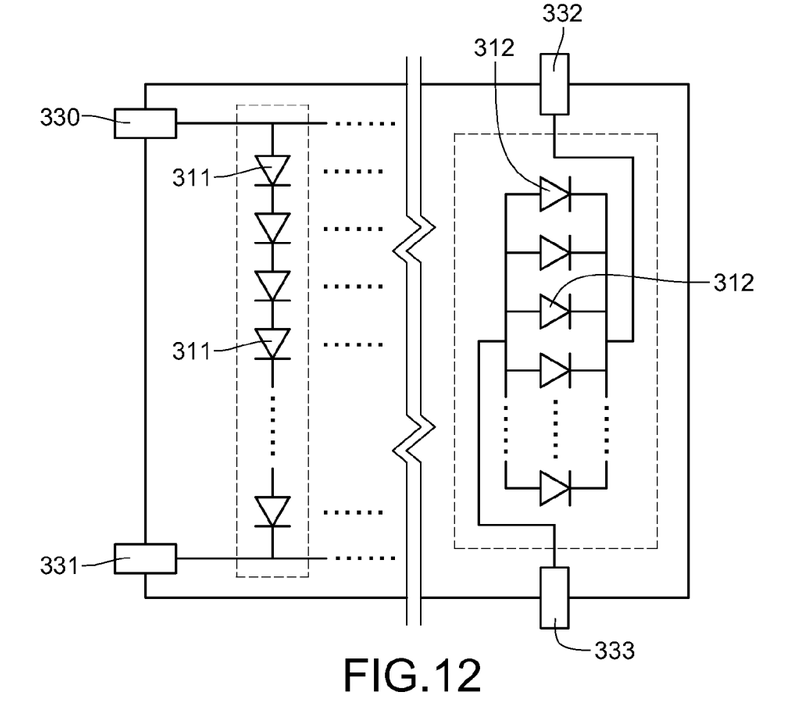
FIG. 12 is a schematic circuit diagram of the fifth embodiment according to the present invention.

FIGS. 10 to 12 are respectively schematic three-dimensional views and a schematic circuit diagram of a fifth embodiment of the present invention. As shown in the figures, a light emitting device 300 according to the fifth embodiment of the present invention comprises a light emitting unit 310 and a submount 320. The light emitting unit 310 is bonded to a side (a top surface) of the submount 320 through flip-chip bonding.

Compared with the conventional wire bonding method, the method of bonding the light emitting unit 310 and the submount 320 through flip-chip bonding may greatly improve the alignment precision and reliability of the light emitting device 300, thus reducing the error during assembling and alleviating the defect of over large encapsulation volume due to wires. The light emitting unit 310 of this embodiment has a structure the same as that of the light emitting unit of the first embodiment, and thus is not repeated herein.

Referring to FIGS. 10 to 12, the light emitting unit 310 according to the fifth embodiment of the present invention is provided with a plurality of first LEDs 311 and a plurality of second LEDs 312. The first LEDs 311 and the second LEDs 312 are respectively arranged at uniform intervals to form a matrix, the first LEDs 311 are electrically connected to electrodes 330 and 331, the second LEDs 312 are electrically connected to electrodes 332 and 333, and the first LEDs 311 and the second LEDs 312 are driven by a voltage to emit illuminating light rays. The numbers of the first LEDs 311 and the second LEDs 312 of this embodiment may be increased or reduced according to actual requirements, and are not limited to the numbers as described in this embodiment.

The submount 320 may be made of sapphire, SiC, Si, GaAs, or AN, and those skilled in the art may select other suitable semiconductor materials to implement the submount 320 in this embodiment, which is not limited thereto. A plurality of first conductive contacts 321 and a plurality of second conductive contacts 322 are electrically disposed on the top surface of the submount 320, and when the light emitting unit 310 is bonded to the submount 320, the first conductive contacts 321 of the submount 320 are coupled to the first LEDs 311 of the light emitting unit 310, such that the first LEDs 311 are electrically connected in series; and each of the second conductive contacts 322 of the submount 320 is correspondingly coupled to each of the second LEDs 312 of the light emitting unit 310, such that the second LEDs 312 are electrically connected in parallel (as shown in FIG. 12).

Specifically, the first conductive contacts 321 on the submount 320 of this embodiment are arranged on the surface of the submount 320, such that two first conductive contacts 321 of each pair are electrically connected to an N pole of an adjacent one of the first LEDs 311 and a P pole of another adjacent one of the first LEDs 311 respectively, and the first conductive contacts 321 are electrically connected to the first LEDs 311 sequentially, such that the first LEDs 311 are electrically connected in series.

For example, as shown in FIG. 10, the plurality of first conductive contacts 321 in this embodiment is disposed on the submount 320 sequentially in a loop connection arrangement, so as to be corresponding to the first LEDs 311 arranged in a matrix. However, those skilled in the art may change the disposing configuration of the first LEDs 311 according to actual requirements, and the first conductive contacts 321 must also change the disposing form thereof accordingly, so as to conform to the electrical connection relation that the first conductive contacts 321 and the first LEDs 311 are electrically connected in series.

The second conductive contacts 322 on the submount 320 of this embodiment are disposed on the surface of the submount 320 in parallel and at intervals, such that two second conductive contacts 322 of each pair are electrically connected to an N pole of an adjacent one of the second LEDs 312 and a P pole of another adjacent one of the second LEDs 312 respectively, such that the adjacent second LEDs 312 are electrically connected in parallel.

The electrical connection relation of the light emitting unit 310 and the submount 320 of the present invention is simplified in this embodiment as three rows of first LEDs 311 and the first conductive contacts 321 of the same number, and three rows of second LEDs 312 and the second conductive contacts 322 of the same number; however, the electrical connection relations between the first LEDs 311 and the first conductive contacts 321 and between the second LEDs 312 and the second conductive contacts 322 of the present invention are not limited thereto.

Figure 13:
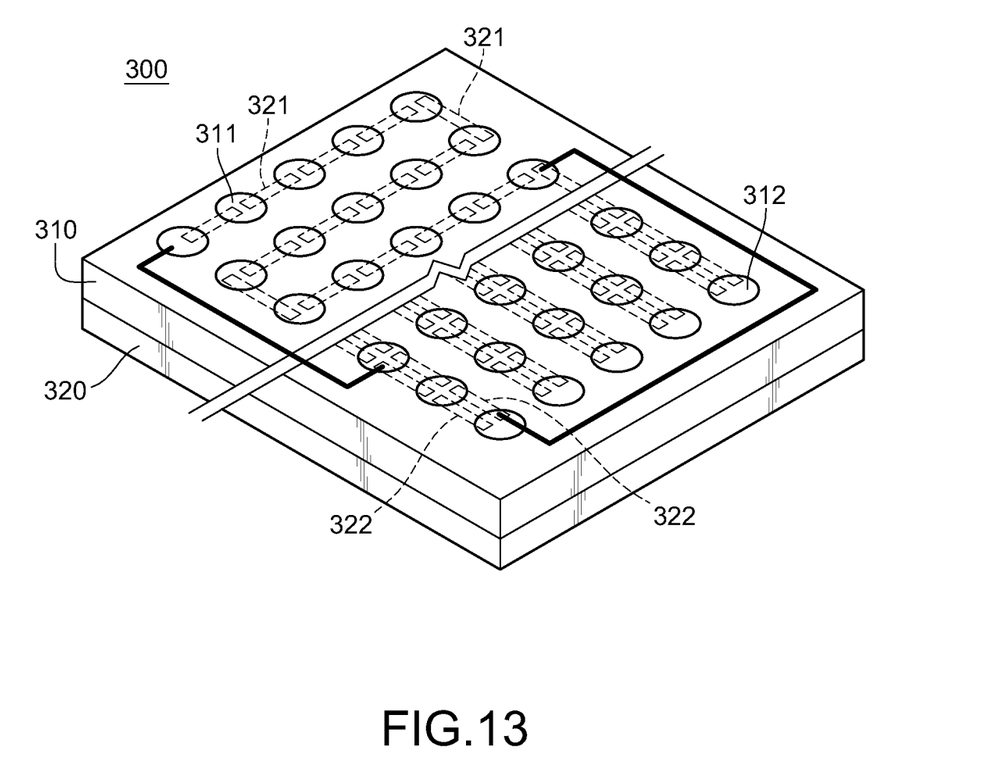
FIG. 13 is a schematic three-dimensional view of a sixth embodiment according to the present invention.
Figure 14:
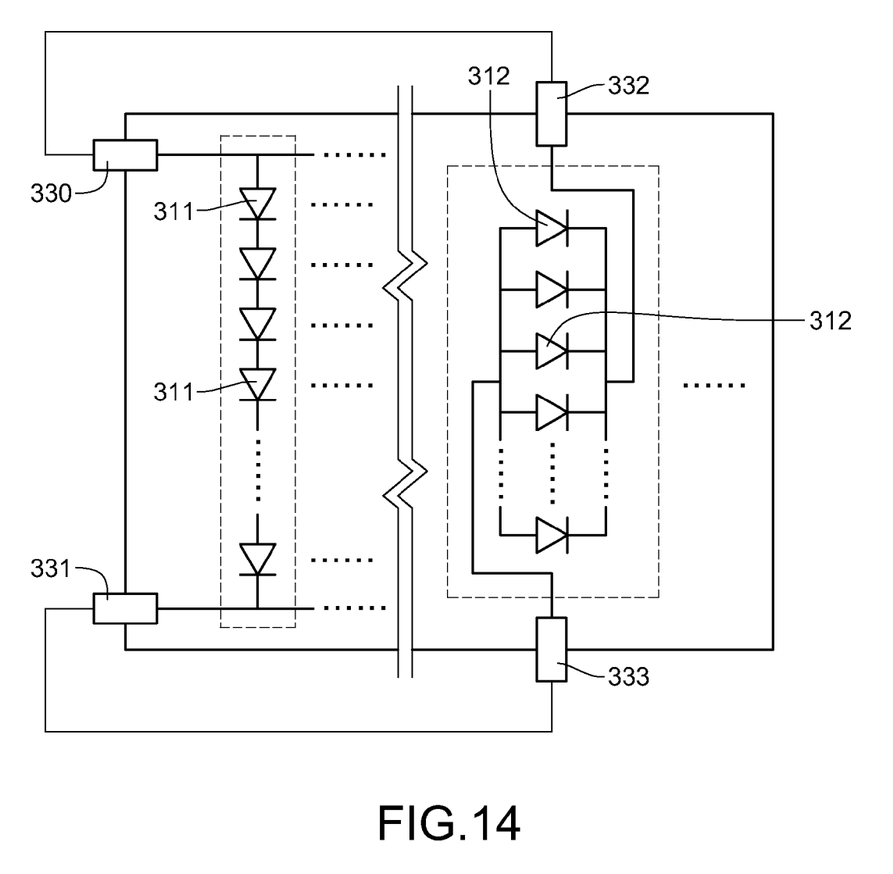
FIG. 14 is a schematic circuit diagram of the sixth embodiment according to the present invention.

Referring to FIGS. 13 and 14, schematic three-dimensional views of a sixth embodiment of the present invention are shown, and since the sixth embodiment has a structure approximately the same as that of the fifth embodiment, only differences are illustrated herein. In the sixth embodiment, a light emitting unit 310 of a light emitting device 300 comprises a plurality of first LEDs 311 and a plurality of second LEDs 312, and a submount 320 comprises a plurality of first conductive contacts 321 and a plurality of second conductive contacts 322. In this embodiment, the numbers of the first LEDs 311 and the second LEDs 312 may be increased or reduced according to actual requirements, which are not limited to the numbers as described in this embodiment.

As shown in FIGS. 13 and 14, the first conductive contacts 321 are electrically connected to the first LEDs 311 in series, and two second conductive contacts 322 of each pair are electrically connected to an N pole of an adjacent one of the second LEDs 312 and a P pole of another adjacent one of the second LEDs 312 respectively, such that the adjacent second LEDs 312 are electrically connected in parallel.

The electrical connection relation of the light emitting unit 310 and the submount 320 of the present invention is simplified in this embodiment as three rows of first LEDs 311 and the first conductive contacts 321 of the same number, and three rows of second LEDs 312 and the second conductive contacts 322 of the same number; however, the electrical connection relations between the first LEDs 311 and the first conductive contacts 321 and between the second LEDs 312 and the second conductive contacts 322 of the present invention are not limited thereto.

As shown in FIGS. 13 and 14, the first LEDs 311 and the second LEDs 312 of the present invention in addition to have the functions described in the fifth embodiment, in this embodiment, more first LEDs 311 in serial connection relation and more second LEDs 312 in parallel connection relation may be electrically connected in parallel.

Specifically, the first LEDs 311 are electrically connected to first electrodes 330 and 331, the second LEDs 312 are electrically connected to second electrodes 332 and 333, and the first LEDs 311 and the second LEDs 312 are driven by a voltage to emit illuminating light rays. In this embodiment, the P pole of the first LED 311 is further electrically connected to the N pole of the second LED 312, such that the first LEDs 311 in serial connection relation and the second LEDs 312 in parallel connection relation are connected in parallel.

Figure 15:
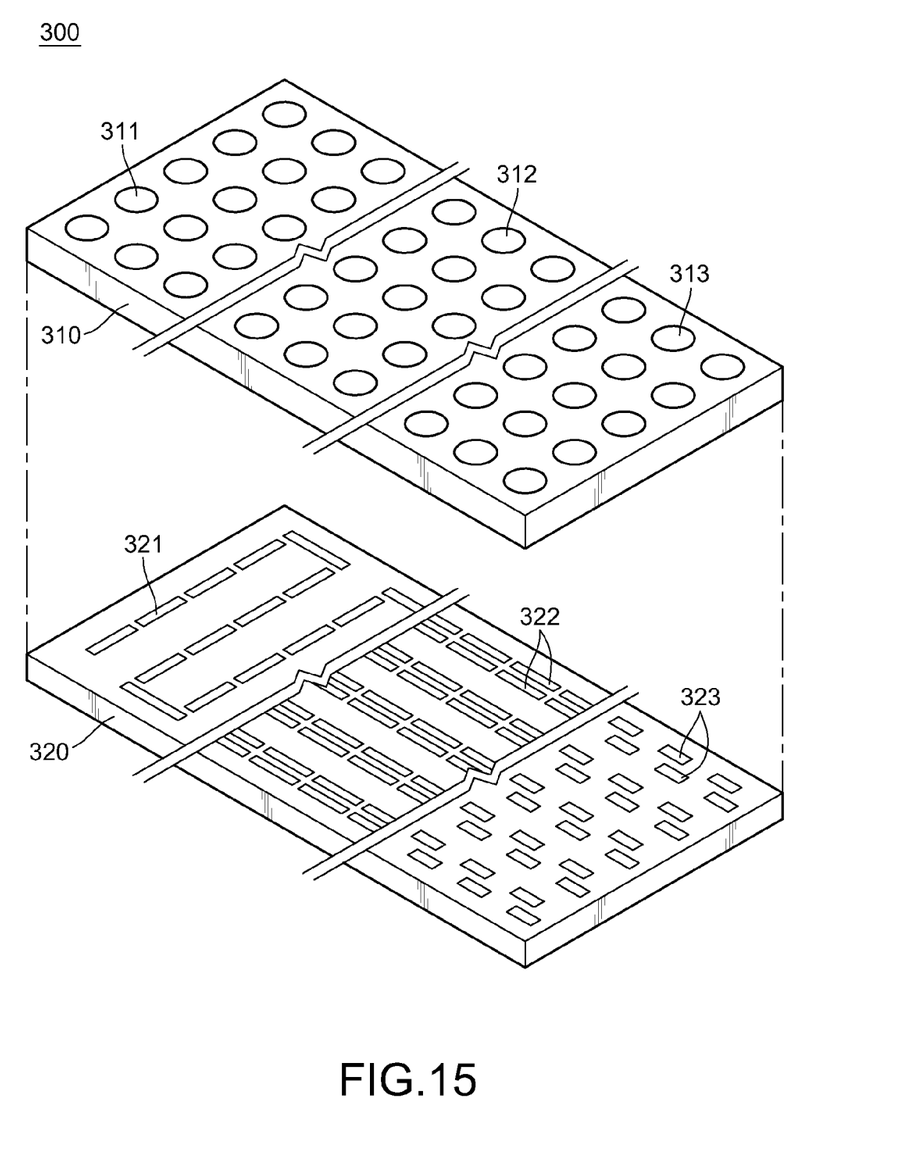
FIG. 15 is a schematic exploded view of a seventh embodiment according to the present invention.

Referring to FIG. 15, a schematic three-dimensional view of a seventh embodiment of the present invention is shown, and since the seventh embodiment has a structure approximately the same as that of the fifth embodiment, only differences are illustrated herein. In the seventh embodiment, in addition to having a plurality of first LEDs 311 and a plurality of second LEDs 312, a light emitting unit 310 of a light emitting device 300 is further provided with a plurality of third LEDs 313, and in addition to having a plurality of first conductive contacts 321 and a plurality of second conductive contacts 322, a submount 320 is further provided with a plurality of third conductive contacts 323. In this embodiment, the third LEDs 313 are driven by a voltage to emit illuminating light rays, and the number of the third LEDs 313 may be increased or reduced according to actual requirements, which is not limited to the number as described in this embodiment. The third conductive contacts 323 may be made of any conductive metal material, non-metal material, or semiconductor material, which is not limited thereto.

As shown in FIG. 15, the third LEDs 313 are adjacent to the second LEDs 312 and form a matrix with the first LEDs 311 and the second LEDs 312, and the third conductive contacts 323 are disposed adjacent to the second conductive contacts 322. The third conductive contacts 323 are electrically disposed on the submount 320 in pairs, and two third conductive contacts 323 are interlaced, thereby being respectively corresponding to N poles and P poles of the third LEDs 313. Therefore, when the light emitting unit 310 is bonded to the submount 320, two third conductive contacts 323 are electrically connected to the N pole and the P pole of one of the third LEDs 313 respectively, thereby forming an electrical conduction relation, such that the third LEDs 313 emit illuminating light rays according to the original driving voltage.

Those skilled in the ark may change the relative positions of the first LEDs 311, the second LEDs 312, the third LEDs 313, and the first conductive contacts 321, the second conductive contacts 322, the third conductive contacts 323 correspondingly, so as to conform to the actual requirements, as long as the electrical connection relations are the same as those described in this embodiment, which is not limited to the forms in this embodiment.

The electrical connection relation of the light emitting unit 310 and the submount 320 of the present invention is simplified in this embodiment as three rows of first LEDs 311 and the first conductive contacts 321 of the same number, three rows of second LEDs 312 and the second conductive contacts 322 of the same number, and three rows of third LEDs 313 and the third conductive contacts 323 of the same number; however, the electrical connection relations between the first LEDs 311 and the first conductive contacts 321, between the second LEDs 312 and the second conductive contacts 322, and between the third LEDs 313 and the third conductive contacts 323 of the present invention are not limited thereto.

Through different layout designs of multiple conductive contacts on the submount of the present invention, it is unnecessary for the LEDs of the light emitting unit of the present invention to be connected in series in advance, and only by bonding the light emitting unit to the submount through flip-chip bonding, the LEDs coupled to the conductive contacts are electrically connected in series or/and in parallel correspondingly.

Therefore, the present invention can greatly improve the design flexibility of the light emitting device, reduce the manufacturing cost, and is applicable to form light emitting devices of high voltage ranged from 15 volts to 400 volts.

What is claimed is:

1. A light emitting device, comprising:
   a light emitting unit, provided with a plurality of first light emitting diodes (LEDs) and a plurality of second LEDs; and
   a submount, provided with a plurality of first conductive contacts and a plurality of second conductive contacts, wherein the plurality of first conductive contacts are coupled to the plurality of first LEDs, such that the plurality of first LEDs are connected in series, and the plurality of second conductive contacts are coupled to the plurality of second LEDs respectively,
   wherein the plurality of second conductive contacts are disposed in pairs, each pair of the plurality of second conductive contacts corresponds to one corresponding second LED, and the two second conductive contacts of each pair of the plurality of second conductive contacts are staggered; and
   wherein each of the plurality of first and second conductive contacts is only electrically connected through one of the plurality of first and second LEDs with any of the other of the plurality of first and second conductive contacts, respectively.

2. The light emitting device according to claim 1, further comprising a pair of electrodes, electrically connected to the plurality of first LEDs.

3. The light emitting device according to claim 1, wherein the light emitting unit is bonded to the submount through flip-chip bonding.

4. The light emitting device according to claim 1, wherein the submount is made of sapphire, SiC, Si, GaAs, or AlN.

5. A light emitting device, comprising:
   a light emitting unit, provided with a plurality of first light emitting diodes (LEDs) and a plurality of second LEDs; and
   a submount, provided with a plurality of first conductive contacts and a plurality of second conductive contacts, wherein each of the plurality of first conductive contacts is correspondingly coupled to each of the plurality of first LEDs, such that the plurality of first LEDs are connected in parallel, and the plurality of second conductive contacts are coupled to the plurality of second LEDs respectively,
   wherein the plurality of second conductive contacts are disposed in pairs, each pair of the plurality of second conductive contacts corresponds to one corresponding second LED, and the two second conductive contacts of each pair of the plurality of second conductive contacts are staggered; and
   wherein each of the plurality of first and second conductive contacts is only electrically connected through one of the plurality of first and second LEDs with any of the other of the plurality of first and second conductive contacts, respectively.

6. The light emitting device according to claim 5, further comprising a pair of electrodes, electrically connected to the plurality of first LEDs.

7. The light emitting device according to claim 5, wherein the light emitting unit is bonded to the submount through flip-chip bonding.

8. The light emitting device according to claim 5, wherein the submount is made of sapphire, SiC, Si, GaAs, or AlN.

9. A light emitting device, comprising:
  a light emitting unit, provided with a plurality of first light emitting diodes (LEDs), a plurality of second LEDs and a plurality of third LEDs; and
  a submount, provided with a plurality of first conductive contacts, a plurality of second conductive contacts and a plurality of third conductive contacts,
  wherein the plurality of first conductive contacts are coupled to the plurality of first LEDs, such that the plurality of first LEDs are connected in series;
  wherein each of the plurality of second conductive contacts is correspondingly coupled to each of the plurality of second LEDs, such that the plurality of second LEDs are connected in parallel;
  wherein the plurality of third conductive contacts are coupled to the plurality of third LEDs respectively; and
  wherein the plurality of third conductive contacts are disposed in pairs, each pair of the plurality of third conductive contacts corresponds to one corresponding third LED, and the two third conductive contacts of each pair of the plurality of third conductive contacts are staggered; and
  wherein each of the plurality of first, second and third conductive contacts is only electrically connected through one of the plurality of first, second and third LEDs with any of the other of the plurality of first, second and third conductive contacts, respectively.

10. The light emitting device according to claim 9, further comprising a pair of first electrodes and a pair of second electrodes, wherein the pair of first electrodes is electrically connected to the plurality of first LEDs, and the pair of second electrodes is electrically connected to the plurality of second LEDs.

11. The light emitting device according to claim 9, wherein the light emitting unit is bonded to the submount through flip-chip bonding.

12. The light emitting device according to claim 9, wherein the submount is made of sapphire, SiC, Si, GaAs, or AlN.

* * * * *